United States Patent
Shen et al.

(10) Patent No.: US 9,021,329 B2
(45) Date of Patent: Apr. 28, 2015

(54) IMPULSE AND/OR BURST NOISE SIGNAL TO NOISE RATIO (SNR) AWARE CONCATENATED FORWARD ERROR CORRECTION (FEC)

(71) Applicant: Broadcom Corporation, Irvine, CA (US)

(72) Inventors: Ba-Zhong Shen, Irvine, CA (US); Avi Kliger, Ramat Gan (IL); Tak K. Lee, Irvine, CA (US); Anatoloi Shindler, Qiryat Ono (IL)

(73) Assignee: Broadcom Corporation, Irvine, CA (US)

( * ) Notice: Subject to any disclaimer, the term of this patent is extended or adjusted under 35 U.S.C. 154(b) by 39 days.

(21) Appl. No.: 13/853,486

(22) Filed: Mar. 29, 2013

(65) Prior Publication Data

US 2013/0227373 A1    Aug. 29, 2013

Related U.S. Application Data

(63) Continuation-in-part of application No. 13/239,841, filed on Sep. 22, 2011, now Pat. No. 8,811,509.

(60) Provisional application No. 61/618,829, filed on Apr. 1, 2012, provisional application No. 61/490,046, filed on May 25, 2011.

(51) Int. Cl.
| | | |
|---|---|---|
| *H03M 13/00* | (2006.01) | |
| *H03M 13/29* | (2006.01) | |
| *H04L 1/00* | (2006.01) | |
| *H04L 25/06* | (2006.01) | |
| *H04L 27/34* | (2006.01) | |

(52) U.S. Cl.
CPC .............. *H03M 13/29* (2013.01); *H04L 25/067* (2013.01); *H04L 27/3416* (2013.01); *H04L 1/005* (2013.01); *H04L 1/0065* (2013.01); *H04L 1/007* (2013.01); *H04L 1/0071* (2013.01)

(58) Field of Classification Search
CPC .......................... H03M 13/2957; H03M 13/29
USPC .................................. 714/755, 752, 756, 786
See application file for complete search history.

(56) References Cited

U.S. PATENT DOCUMENTS

| | | | |
|---|---|---|---|
| 7,499,506 B2 * | 3/2009 | Ghosh et al. | 375/329 |
| 7,577,100 B2 * | 8/2009 | Pollmann et al. | 370/252 |
| 8,804,876 B2 * | 8/2014 | Sikri et al. | 375/329 |

* cited by examiner

*Primary Examiner* — Fritz Alphonse
(74) *Attorney, Agent, or Firm* — Garlick & Markison; Shayne X. Short

(57) ABSTRACT

Impulse and/or burst noise signal to noise ratio (SNR) aware concatenated forward error correction (FEC). Adaptive processing is performed on a signal based on one or more effects which may deleteriously modify a signal. For example, based on a modification of a signal to noise ratio (SNR) associated with one or more impulse or burst noise events, which may be estimated, different respective processing may be performed selectively to differently affected bits associated with the signal. For example, two respective SNRs may be employed: a first SNR for one or more first bits, and a second SNR for one or more second bits. For example, as an impulse or burst noise event may affect different respective bits of a codeword differently, and adaptive processing may be made such that different respective bits of the codeword may be handled differently.

20 Claims, 9 Drawing Sheets

IMPULSE AND/OR BURST NOISE SIGNAL TO NOISE RATIO (SNR) AWARE CONCATENATED FORWARD ERROR CORRECTION (FEC)

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

1. U.S. Provisional Patent Application Ser. No. 61/618, 829, entitled "Concatenated forward error correction (FEC) with signal to noise ratio (SNR) awareness," filed Apr. 1, 2012.

Continuation-in-Part (CIP) Priority Claim, 35 U.S.C. §120

The present U.S. Utility Patent Application claims priority pursuant to 35 U.S.C. §120, as a continuation-in-part (CIP), to the following U.S. Utility Patent Application which is hereby incorporated herein by reference in its entirety and made part of the present U.S. Utility Patent Application for all purposes:

1. U.S. Utility patent application Ser. No. 13/239,841, entitled "Forward error correction (FEC) m-bit symbol modulation," filed Sep. 22, 2011, now issued as U.S. Pat. No. 8,811,509 B2 on Aug. 19, 2014, which claims priority pursuant to 35 U.S.C. §119(e) to the following U.S. Provisional Patent Application which is hereby incorporated herein by reference in its entirety and made part of the present U.S. Utility Patent Application for all purposes:

1.1. U.S. Provisional Patent Application Ser. No. 61/490, 046, entitled "Forward error correction (FEC) m-bit symbol modulation," filed May 25, 2011.

BACKGROUND OF THE INVENTION

1. Technical Field of the Invention

The invention relates generally to communication systems; and, more particularly, it relates to forward error correction (FEC) coding and/or error correction code (ECC) coding within such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems including those that may employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

DETAILED DESCRIPTION OF THE INVENTION

Figure 1:
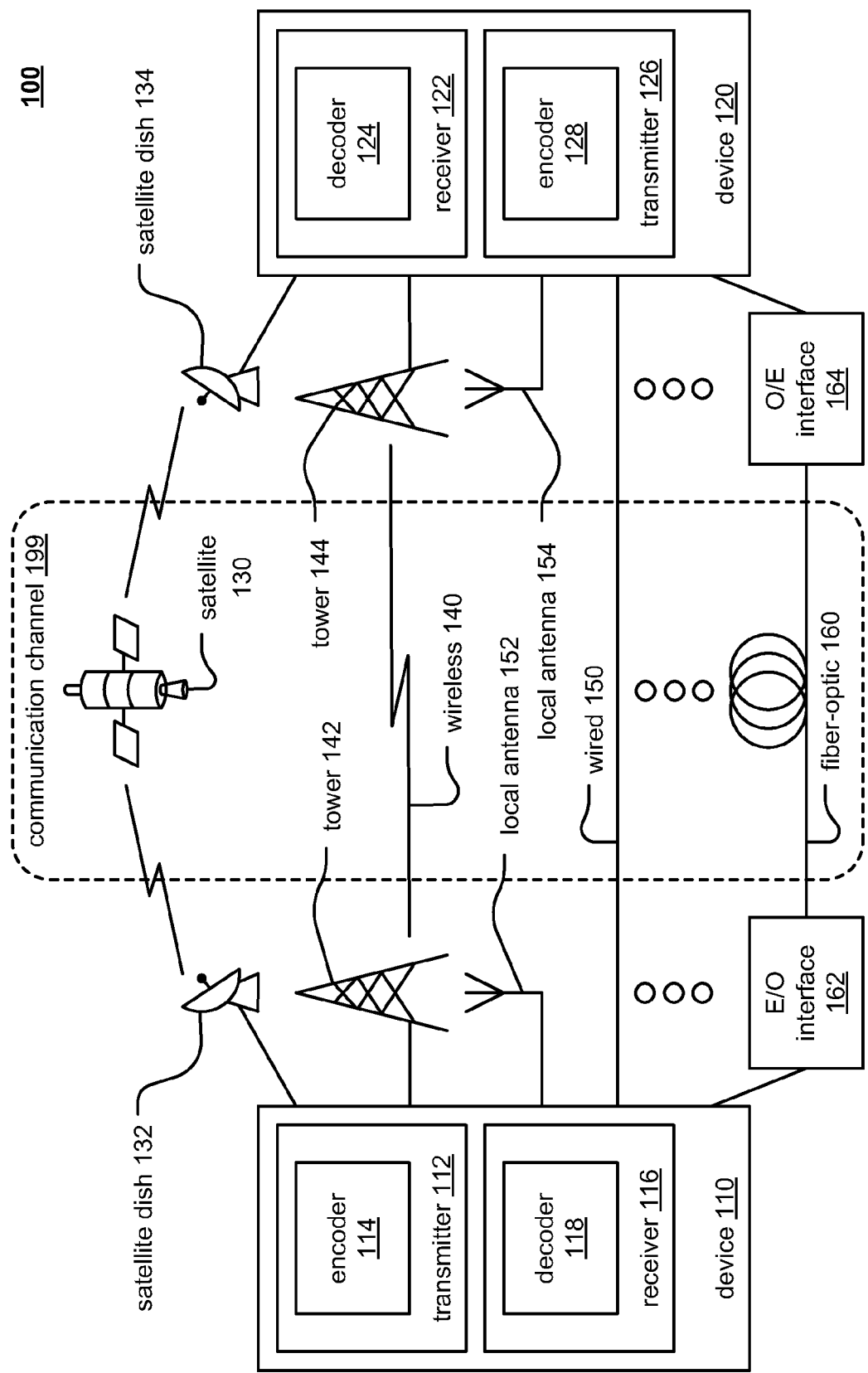
FIG. 1, FIG. 2, and FIG. 3 illustrate various embodiments of communication systems.

Within communication systems, signals are transmitted between various communication devices therein. The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
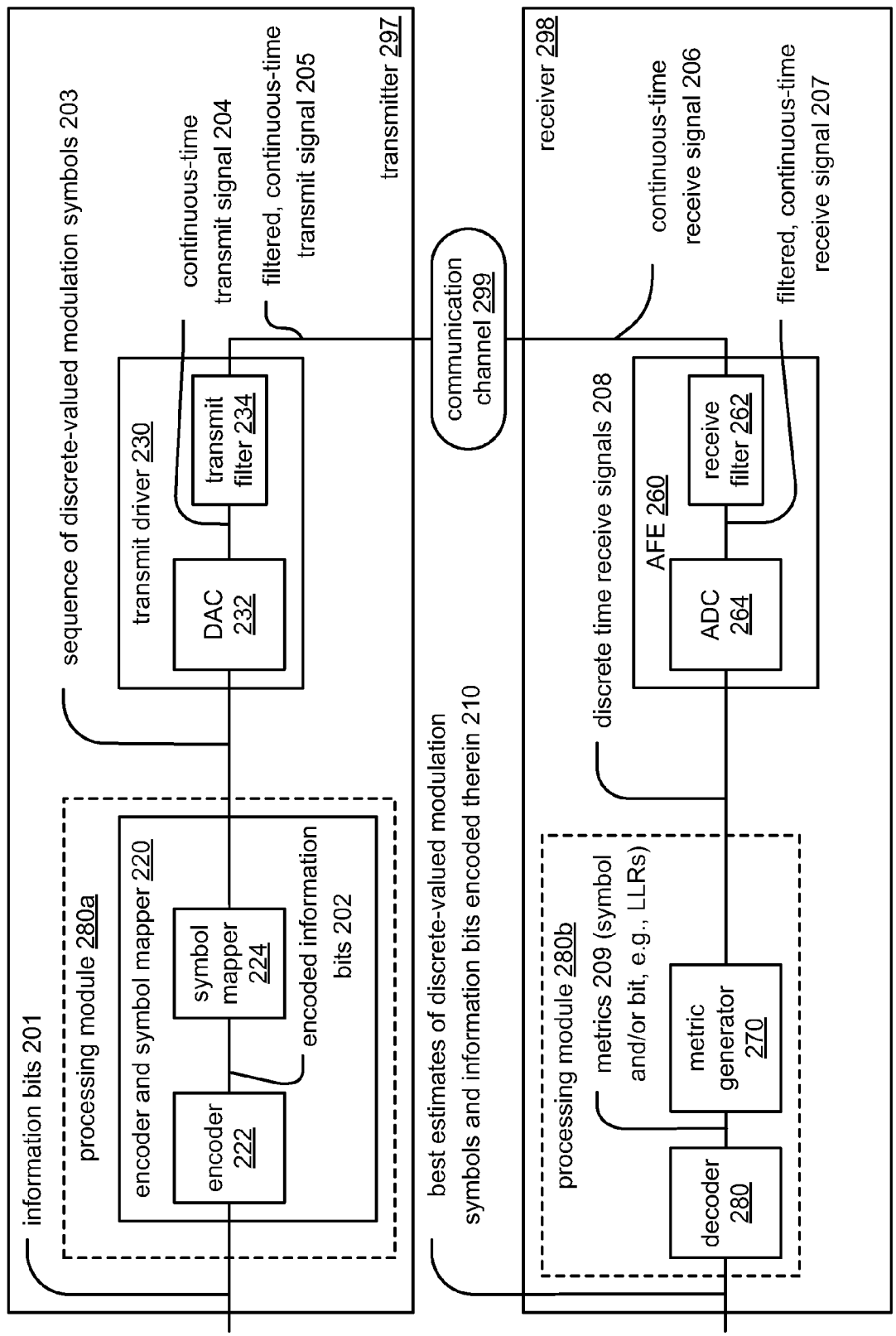

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter end of the communication channel 199 and a decoder at the receiver end of the communication channel 199.

Any of various types of ECC codes described can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Generally speaking, when considering a communication system in which video data is communicated from one location, or subsystem, to another, video data encoding may generally be viewed as being performed at a transmitting end of the communication channel 199, and video data decoding may generally be viewed as being performed at a receiving end of the communication channel 199.

Also, while the embodiment of this diagram shows bi-directional communication being capable between the communication devices 110 and 120, it is of course noted that, in some embodiments, the communication device 110 may include only video data encoding capability, and the communication device 120 may include only video data decoding capability, or vice versa (e.g., in a uni-directional communication embodiment such as in accordance with a video broadcast embodiment).

It is noted that such communication devices 110 and/or 120 may be stationary or mobile without departing from the scope and spirit of the invention. For example, either one or both of the communication devices 110 and 120 may be implemented in a fixed location or may be a mobile communication device with capability to associate with and/or communicate with more than one network access point (e.g., different respective access points (APs) in the context of a mobile communication system including one or more wireless local area networks (WLANs), different respective satellites in the context of a mobile communication system including one or more satellite, or generally, different respective network access points in the context of a mobile communication system including one or more network access points by which communications may be effectuated with communication devices 110 and/or 120.

Referring to the communication system 200 of FIG. 2, at a transmitting end of a communication channel 299, information bits 201 (e.g., corresponding particularly to video data in one embodiment) are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

Within each of the transmitter 297 and the receiver 298, any desired integration of various components, blocks, functional blocks, circuitries, etc. Therein may be implemented. For example, this diagram shows a processing module 280a as including the encoder and symbol mapper 220 and all associated, corresponding components therein, and a processing module 280 is shown as including the metric generator 270 and the decoder 280 and all associated, corresponding components therein. Such processing modules 280a and 280b may be respective integrated circuits. Of course, other boundaries and groupings may alternatively be performed without departing from the scope and spirit of the invention. For example, all components within the transmitter 297 may be included within a first processing module or integrated circuit, and all components within the receiver 298 may be included within a second processing module or integrated circuit. Alternatively, any other combination of components within each of the transmitter 297 and the receiver 298 may be made in other embodiments.

As with the previous embodiment, such a communication system 200 may be employed for the communication of video data is communicated from one location, or subsystem, to another (e.g., from transmitter 297 to the receiver 298 via the communication channel 299).

Figure 3:
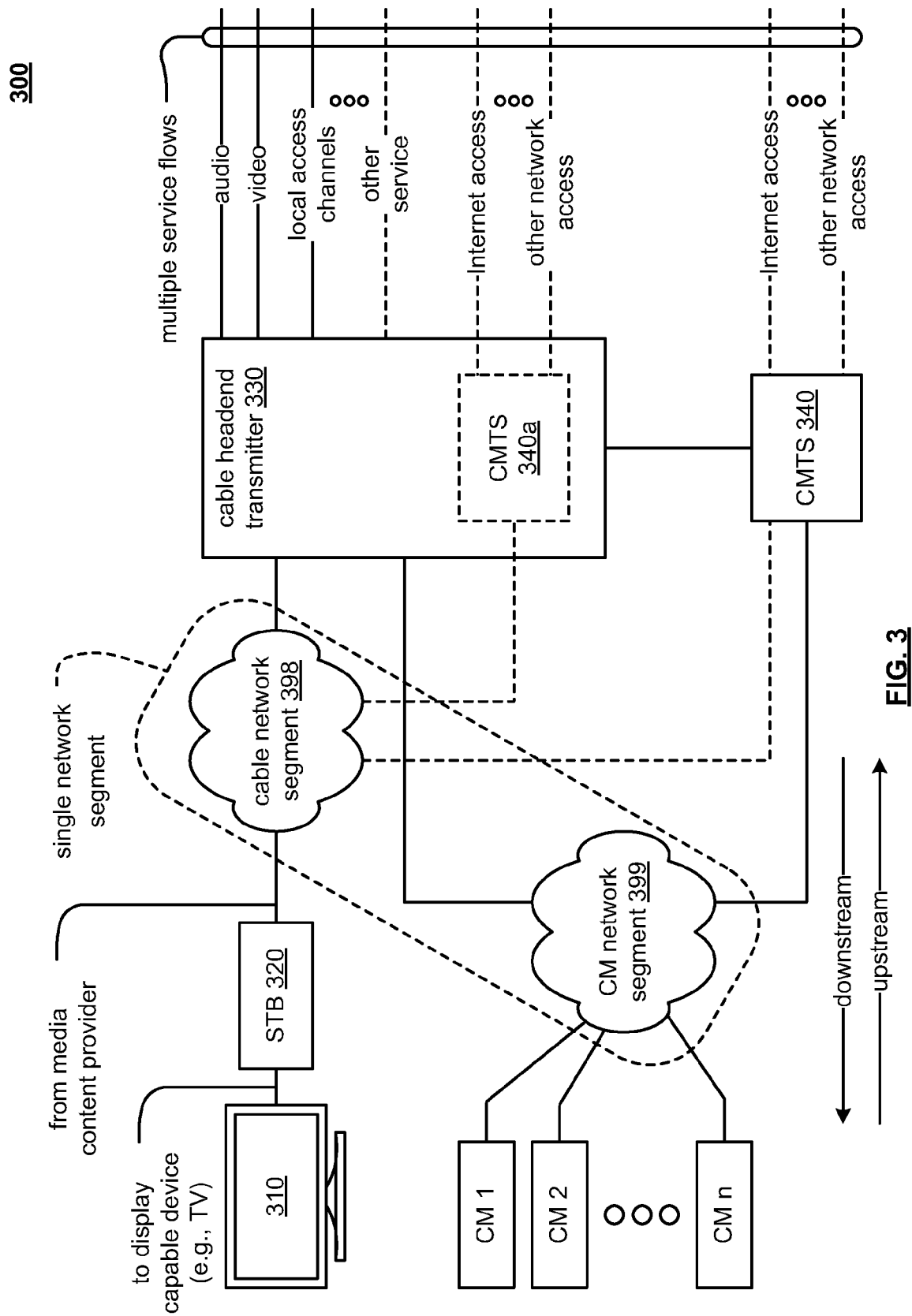

Referring to the communication system 300 of FIG. 3, this communication system 300 may be viewed particularly as being a cable system. Such a cable system may generally be referred to as a cable plant and may be implemented, at least in part, as a hybrid fiber-coaxial (HFC) network (e.g., including various wired and/or optical fiber communication segments, light sources, light or photo detection complements, etc.). For example, the communication system 300 includes a number of cable modems (shown as CM 1, CM 2, and up to CM n). A cable modem network segment 399 couples the cable modems to a cable modem termination system (CMTS) (shown as 340 or 340a and as described below).

A CMTS 340 or 340a is a component that exchanges digital signals with cable modems on the cable modem network segment 399. Each of the cable modems coupled to the cable modem network segment 399, and a number of elements may be included within the cable modem network segment 399. For example, routers, splitters, couplers, relays, and amplifiers may be contained within the cable modem network segment 399.

The cable modem network segment 399 allows communicative coupling between a cable modem (e.g., a user) and the cable headend transmitter 330 and/or CMTS 340 or 340a. Again, in some embodiments, a CMTS 340a is in fact contained within a cable headend transmitter 330. In other embodiments, the CMTS is located externally with respect to the cable headend transmitter 330 (e.g., as shown by CMTS 340). For example, the CMTS 340 may be located externally to the cable headend transmitter 330. In alternative embodiments, a CMTS 340a may be located within the cable headend transmitter 330. The CMTS 340 or 340a may be located at a local office of a cable television company or at another location within a cable system. In the following description, a CMTS 340 is used for illustration; yet, the same functionality and capability as described for the CMTS 340 may equally apply to embodiments that alternatively employ the CMTS 340a. The cable headend transmitter 330 is able to provide a number of services including those of audio, video, local access channels, as well as any other service of cable systems. Each of these services may be provided to the one or more cable modems (e.g., CM 1, CM 2, etc.). In addition, it is noted that the cable headend transmitter 330 may provide any of these various cable services via cable network segment 398 to a set top box (STB) 320, which itself may be coupled to a television 310 (or other video or audio output device). While the STB 320 receives information/services from the cable headend transmitter 330, the STB 320 functionality may also support bi-directional communication, in that, the STB 320 may independently (or in response to a user's request) communicate back to the cable headend transmitter 330 and/or further upstream.

In addition, through the CMTS 340, the cable modems are able to transmit and receive data from the Internet and/or any other network (e.g., a wide area network (WAN), internal network, etc.) to which the CMTS 340 is communicatively coupled. The operation of a CMTS, at the cable-provider's head-end, may be viewed as providing analogous functions provided by a digital subscriber line access multiplexor (DSLAM) within a digital subscriber line (DSL) system. The CMTS 340 takes the traffic coming in from a group of customers on a single channel and routes it to an Internet Service Provider (ISP) for connection to the Internet, as shown via the Internet access. At the head-end, the cable providers will have, or lease space for a third-party ISP to have, servers for accounting and logging, dynamic host configuration protocol (DHCP) for assigning and administering the Internet protocol (IP) addresses of all the cable system's users (e.g., CM 1, CM2, etc.), and typically control servers for a protocol called Data Over Cable Service Interface Specification (DOCSIS), the major standard used by U.S. cable systems in providing Internet access to users. The servers may also be controlled for a protocol called European Data Over Cable Service Interface Specification (EuroDOCSIS), the major standard used by European cable systems in providing Internet access to users, without departing from the scope and spirit of the invention.

The downstream information flows to all of the connected cable modems (e.g., CM 1, CM2, etc.). The individual network connection, within the cable modem network segment 399, decides whether a particular block of data is intended for it or not. On the upstream side, information is sent from the cable modems to the CMTS 340; on this upstream transmission, the users within the group of cable modems to whom the data is not intended do not see that data at all. As an example of the capabilities provided by a CMTS, a CMTS will enable as many as 1,000 users to connect to the Internet through a single 6 Mega-Hertz channel. Since a single channel is capable of 30-40 Mega-bits per second of total throughput (e.g., currently in the DOCSIS standard, but with higher rates envisioned such as those sought after in accordance with the developing DVB-C2 (Digital Video Broadcasting—Second Generation Cable) standard, DVB-T2 (Digital Video Broadcasting—Second Generation Terrestrial) standard, etc.), this means that users may see far better performance than is available with standard dial-up modems.

Moreover, it is noted that the cable network segment 398 and the cable modem network segment 399 may actually be the very same network segment in certain embodiments. In other words, the cable network segment 398 and the cable modem network segment 399 need not be two separate network segments, but they may simply be one single network segment that provides connectivity to both STBs and/or cable modems. In addition, the CMTS 340 or 340a may also be coupled to the cable network segment 398, as the STB 320 may itself include cable modem functionality therein.

It is also noted that any one of the cable modems 1, 2, ... m n, the cable headend transmitter 330, the CMTS 340 or 340a, the television 310, the STB 320, and/or any device existent within the cable network segments 398 or 399, may include a memory optimization module as described herein to assist in the configuration of various modules and operation in accordance with any one of a plurality of protocols therein.

Various communication devices can operate by employing an equalizer therein (e.g., an adaptive equalizer). Some examples of such communication devices include those described herein, including cable modems (CMs). However, it is noted that various aspects and principles presented herein may be generally applied to any type of communication device located within any of a variety of types of communication systems. For example, while some illustrative and exemplary embodiments herein employ the use of a CM in particular, though it is noted that such aspects and principles presented herein may be generally applied to any type of communication device located within any of a variety of types of communication systems.

Various communication devices (e.g., a cable modem (CM), a cable modem termination system (CMTS), etc.) may report information there between and coordinate operation thereof.

It is again noted that while the particular illustrative example of a cable modem (CM) is employed in a number of different embodiments, diagrams, etc. herein, such architectures, functionality, and/or operations may generally be included and/or performed within any of a number of various types of communication devices including those operative in accordance with the various communication system types, including those having more than one communication medium type therein, such as described with reference to FIG. 1.

Figure 4:
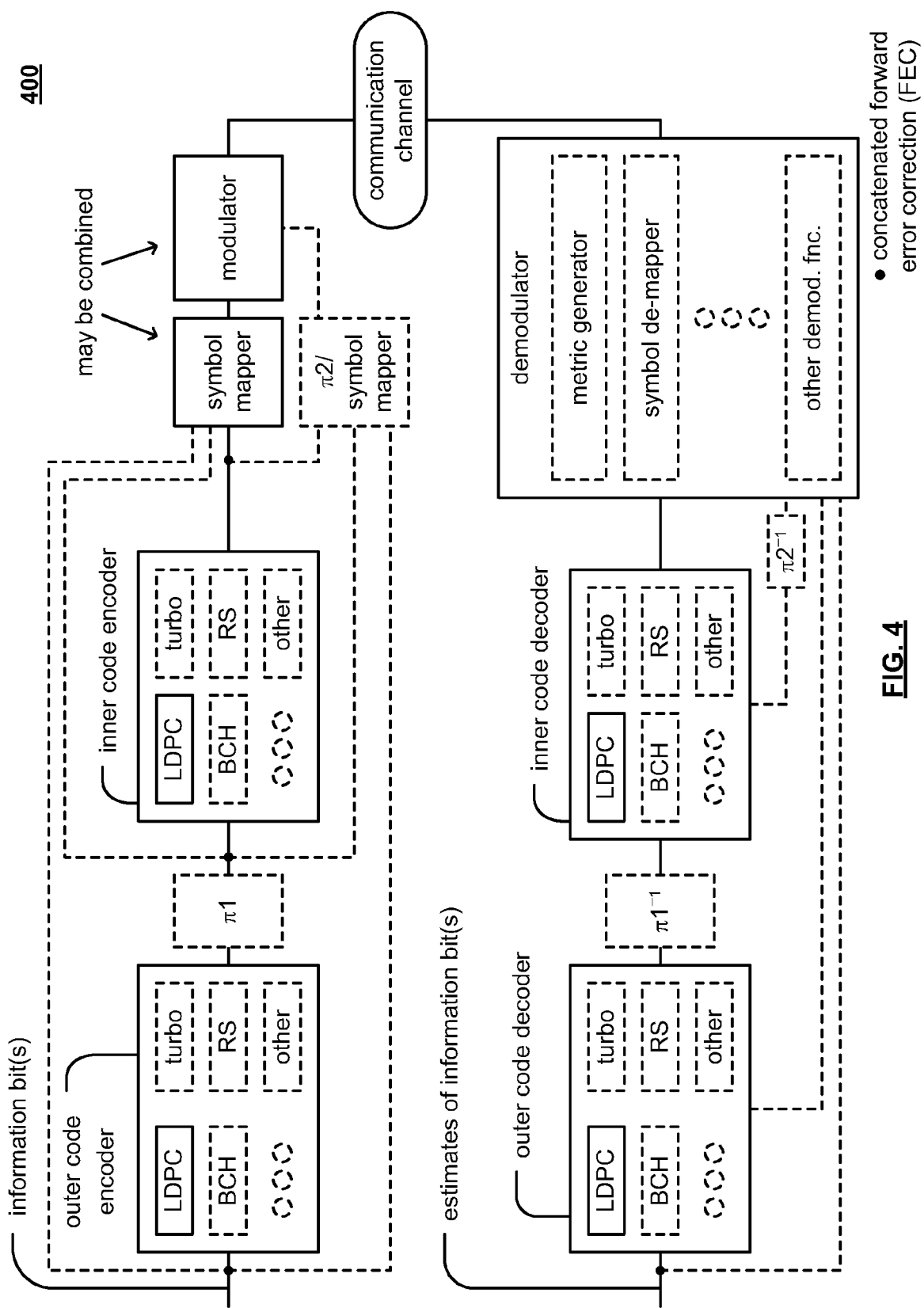
FIG. 4 illustrates an alternative embodiment of a communication system.

FIG. 4 illustrates an alternative embodiment of a communication system 400. Initially, information bits are provided to an outer code encoder. Such an outer code encoder may be implemented in accordance with any of a variety of error correction codes (ECCs) and/or forward error corrections (FECs). For example, the outer code encoder may be implemented in accordance with low density parity check (LDPC) coding, turbo coding, BCH (Bose and Ray-Chaudhuri, and Hocquenghem) coding, Reed-Solomon (RS) coding, convolutional coding, turbo trellis coded modulation (TTCM) coding, etc. and/or any other type of coding and/or combination thereof.

The encoded bits (e.g., alternatively and equivalently referred to as coded bits in various diagrams and/or embodiments herein) output from the outer code encoder are provided to an interleaver ($\pi 1$) that performs a first interleaving. The output from the interleaver ($\pi 1$) is provided to an inner code encoder. Such an inner code encoder may be implemented in accordance with any of a variety of ECCs and/or FECs. For example, the inner code encoder may be implemented in accordance with LDPC coding, turbo coding, BCH coding, RS coding, convolutional coding, TTCM coding, etc. and/or any other type of coding and/or combination thereof.

The input provided to a symbol mapper may include at least one uncoded bit, at least one coded bit, and/or at least one codeword. The architecture shown in this diagram may generally be viewed as including outer coding and inner coding.

The symbol mapper may be implemented to perform any desired symbol mapping which may symbol map different symbols to different modulations (i.e., constellations with respective mappings of the constellation points therein). In addition, a given shaped constellation may have at least two corresponding mappings of the constellation points therein such that any one of the various mappings is employed at a given time or for mapping a given label or symbol.

In alternative embodiments, the information bits, the outer code encoded bits, and/or the inner code symbol mapper may be provided to an interleaver ($\pi 2$)/symbol mapper implemented to perform any desired combination of interleaving and symbol mapping which may symbol map different symbols to different modulations (i.e., constellations with respective mappings of the constellation points therein).

A modulator (e.g., which may be viewed as being an embodiment of a transmit driver) performs any necessary modification (e.g., frequency conversion, gain adjustment, filtering, etc.) to the sequence of discrete-valued modulation symbols output from the symbol mapper or the interleaver ($\pi$)/symbol mapper to generate a continuous time signal that comports with the characteristics of communication channel (e.g., including filtering, digital to analog conversion, frequency conversion, gain adjustment, etc.).

A demodulator is operative to receive the signal from the communication channel (e.g., the signal may have incurred certain deleterious effects including noise, interference, multi-path effects, etc.) and perform demodulation thereon. This may involve the calculation of certain metrics (e.g., by a metric generator, including log-likelihood ratios (LLRs), etc.) and symbol de-mapping (e.g., by a symbol de-mapper) for use in subsequent decoding. This may also involve any other demodulation function (e.g., as shown by reference numeral) including filtering, analog to digital conversion, frequency conversion, gain adjustment, etc.

After undergoing the demodulation operations, in embodiments that include the interleaver ($\pi$)/symbol mapper, the bit sequence generated by the demodulator undergoes de-interleaving in de-interleaver ($\pi^{-1}$). After undergoing the demodulation operations, in embodiments that include the symbol de-mapper, the bit sequence generated by the demodulator is provided to an inner code decoder (e.g., corresponding to the inner code encoder).

The inner code decoder then decodes the bit sequence output from the demodulator or the de-interleaver ($\pi 2^{-1}$) to generate a sequence of estimated bits that subsequently undergo outer decoding in an outer decoder from which estimates of the information bits are generated.

The outer code decoder includes and is operative to employ a corresponding ECC and/or FEC as employed by the outer code encoder (e.g., LDPC coding, turbo coding, BCH coding, RS coding, convolutional coding, TTCM coding, etc. and/or any other type of coding and/or combination thereof). Generally speaking, the outer code decoder is implemented using a code corresponding to the type of code employed within the outer code encoder. Estimates of the original information bits are output from the outer code decoder.

A novel system and architecture is presented herein by which signal mapping may be performed for symbols composed of mixed coded and uncoded bits. Generally speaking, signal mapping may be viewed as corresponding a symbol or label (e.g., one or more bits, though typically two or more bits) to a given constellation point associated with that symbol or label in a two-dimensional mapping. Typically, the two axes of such a two-dimensional mapping are I and Q axes (e.g., in phase and quadrature axes). A given modulation may generally be viewed as a plurality of constellation points such that each respective constellation point therein has a label associated thereto. For example, when a given symbol undergoes signal mapping in accordance with a given modulation, the particular bits of that symbol are associated with a particular constellation point within the two-dimensional mapping. A continuous time signal may be generated such that a symbol, after undergoing signal mapping in accordance with a given modulation, is translated to a signal having a particular magnitude (e.g., associated with Euclidean distance from the origin of the two-dimensional mapping) and a particular phase (e.g., the angular trajectory extending from the origin of the two-dimensional mapping to the particular constellation point to which that symbol gets associated).

In addition, certain embodiments relate to the selection of a best suitable number of coded bits may be used within a given modulation to achieve the highest possible code rates. When uncoded bits are employed within a given modulation, an error floor may unfortunately be generated. Certain embodiments herein relate to mitigating any such error floor as may be caused by uncoded bits.

Also, as can be seen with respect to this diagram, any desired combination of coded bits and/or uncoded bits may be differentially and/or separately provided for undergoing symbol mapping. For example, uncoded bits extracted from or selected from the information bits may be provided directly to the symbol mapper and/or the interleaver ($\pi$)/symbol mapper. Also, coded bits that have been generated by the outer code encoder may be provided directly to the symbol mapper and/or the interleaver ($\pi$)/symbol mapper. Of course, those coded bits which may be generated by the LDPC encoder may also be provided directly to the symbol mapper and/or the interleaver ($\pi$)/symbol mapper. It is also noted that bits which have not undergone encoding in accordance with the outer code encoder, such as one or more of the information bits, may also bypass the outer code encoder and be provided directly to the inner code encoder. That is to say, certain coded bits may be generated such that they are only encoded in accordance with the inner code encoder, but they are not encoded in accordance with the outer code encoder. Any desired combination of coded bits, which may be generated by one or both of an inner code encoder and an outer code encoder, as well as uncoded bits may be differentially and/or separately provided for undergoing symbol mapping.

In certain communication systems, impulse and/or burst noise may occur. For example, as a signal is transmitted via a communication link, if a communication link is impulse and/or birth noise affected, then some (one or more) portions of that signal may be deleteriously affected. Information included within those impulse and/or burst noise affected portions may be similarly affected. In some instances, impulse and/or burst noise affected portions of the signal are treated as being entirely lost. That is to say, information associated with those impulse and/or burst noise affected portions of the signal are treated as erasures. Herein, and impulse and/or burst noise SNR aware concatenated FEC is presented. Such a concatenated FEC may be used to protect from the deleterious effects of impulse and/or burst noise in a communication system. Generally speaking, concatenated coding is implemented using an outer ECC and/or FEC code, and interleaver, and then inner ECC and/or FEC code. In certain implementations, common SNR is employed or assumed for in entirety of a given signal. For example, for a given the codeword, a singular SNR is assumed that employed in accordance with decoding the entirety of such a codeword. Such an interleaver may be operative to distribute any errors associated with an impulse and/or burst noise event.

Herein, an adaptive approach is presented by which different respective bits of a signal are handled differently based upon the SNR associated with one or more impulse and/or burst noise events. For example, those portions of a signal associated with an impulse and/or burst noise events are handled differently than those portions of the signal that are not impulse and or worse noise affected. A variety of different ways may be made such that adaptation based upon one or more impulse and/or burst noise events, and the associated SNR(s) associated therewith. For example, processing of the signal may be performed similarly for all respective bits of the received signal, yet those bits associated with an impulse and/or burst noise event are subsequently modified based upon SNR associated with the impulse and/or burst noise event. Alternatively, the processing of the signal may be modified based upon the different SNR associated with an impulse and/or burst noise event such that a different associated SNR will inherently affect the processing of the signal portions that are impulse and/or burst noise affected (e.g., considering the processing of the signal to be based, at least in part, on the SNR that is different within one or more impulse and/or burst noise events than within those portions of the signal that are not impulse and/or burst noise affected).

Figure 5:
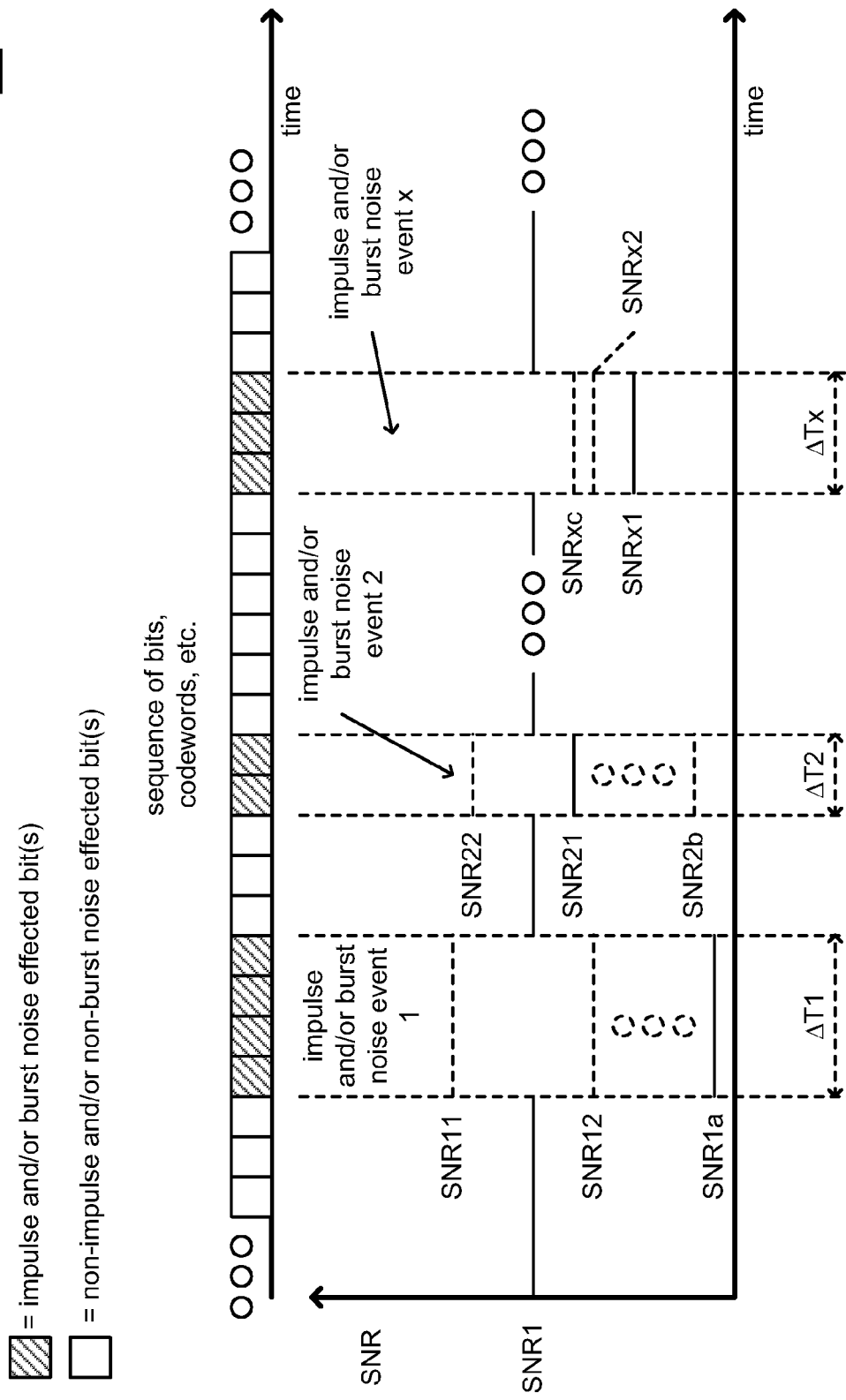
FIG. 5 illustrates an embodiment of one or more impulse and/or burst noise events affected certain bits, codewords, etc. (e.g., such as during transmission via a communication channel).

FIG. 5 illustrates an embodiment 500 of one or more impulse and/or burst noise events affected certain bits, codewords, etc. (e.g., such as during transmission via a communication channel). Considering this diagram, a sequence of bits, codewords, etc. may be unfortunately and deleteriously affected by one or more bur impulse and/or burst noise events. Also, it is noted here that while many references to impulse and/or burst noise are provided, when reference is made to only one of impulse or burst noise, the other reference may be included and/or interchanged there with without departing from the scope and spirit of the invention.

As may be seen with effective this diagram, certain of the bits, codewords, etc. associated with a received signal may be affected by one or more impulse and/or burst noise events while other bits, codewords, etc. are not so affected. Generally speaking, a given SNR may be used for those portions of the signal not affected by an impulse and/or burst noise event, while consideration is made with respect to a different associated SNR for impulse and/or burst noise affected portions of the signal. Generally speaking, an SNR associated with an impulse and/or burst noise event will be lower than the SNR associated with those non-burst noise affected portions of the signal. However, there may be some situations in which the SNR associated with an impulse and/or burst noise event will be higher than the SNR associated with those non-burst noise affected portions of the signal.

In many communication systems, the SNR associated within impulse and/or burst noise event can be estimated. For example, in certain embodiments, the SNR associated with an impulse and/or burst noise event is below the non-impulse and/or burst noise affected portion of the signal by approximately 10 dBc or 20 dBc (e.g., the dB relative to the carrier or non-impulse and/or burst noise affected portion of the signal).

For example, such estimation of SNR may be made in accordance with the EPON (Ethernet Passive Optical Network) Protocol over a Coax (EPoC). In certain situations, the relative duration of an impulse and/or burst noise event is approximately in the range of 10 to 20 μs. For example, a receiver type device may perform estimation of SNR for every bit in a received codeword. As such, adaptive accommodation of SNR for those bits that may be impulse and/or burst noise affected. That is to say, given that SNR may be estimated for different respective portions of a received signal, any impulse and/or burst noise affected portions of the signal may be handled differently than those portions of the signal that are not impulse and/or burst noise affected.

Figure 6:
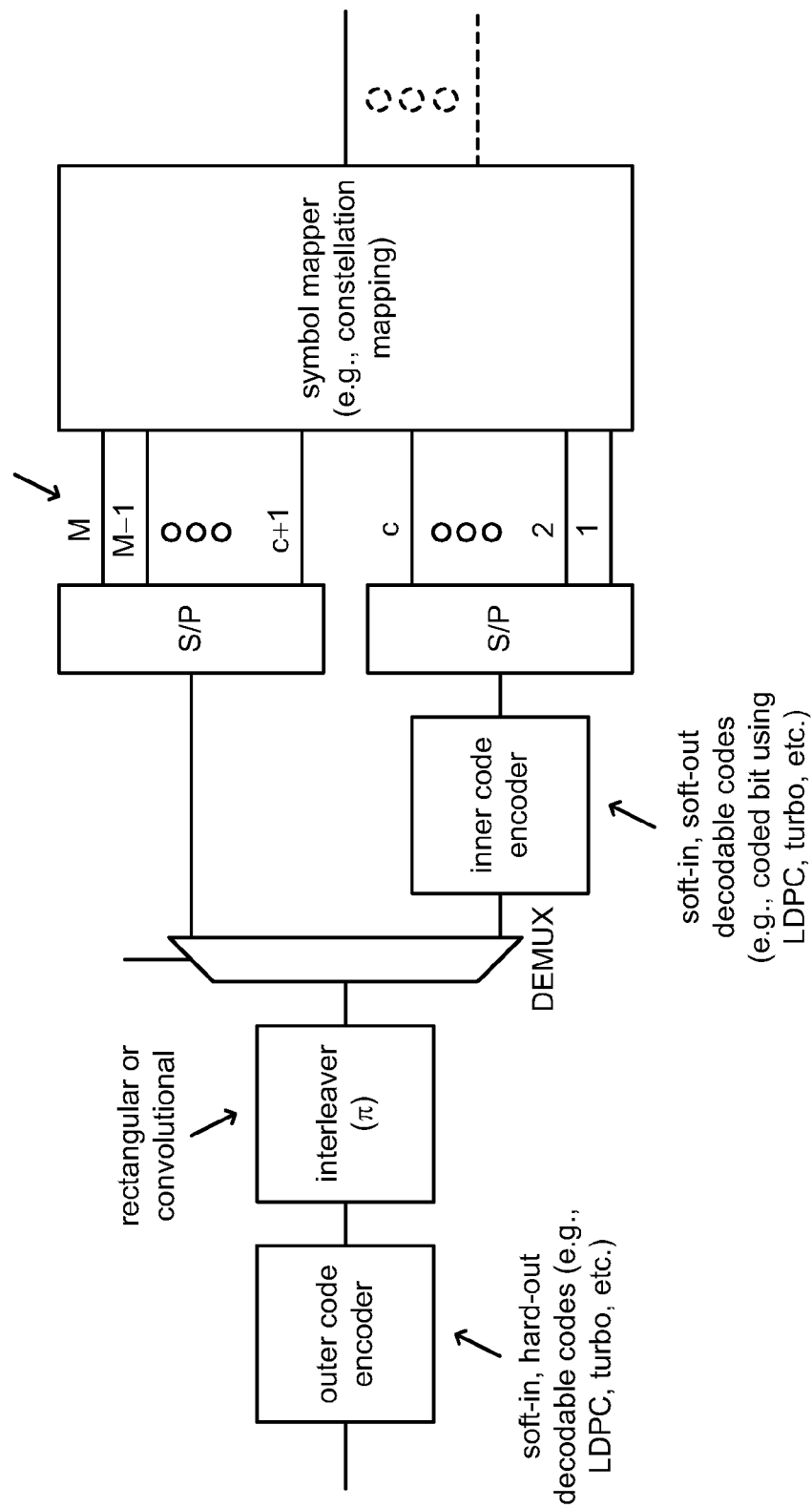
FIG. 6 illustrates an embodiment of impulse and/or burst noise signal to noise ratio (SNR) aware concatenated forward error correction (FEC), and particularly showing the encoder and/or transmitter side associated therewith.

FIG. 6 illustrates an embodiment 600 of impulse and/or burst noise signal to noise ratio (SNR) aware concatenated forward error correction (FEC), and particularly showing the encoder and/or transmitter side associated therewith. Herein, an outer code encoder is implemented using a soft decision decodable code. For example, such an FEC may be implemented in accordance with LDPC, turbo code, etc. generally speaking, such an outer code encoder may be viewed as being a soft-in hard-out decodable code. With respect to the input to such an outer code encoder, awareness is provided with respect to SNR. For example, calculation of LLR may be made based on awareness of the SNR associated with one or more impulse and/or burst noise events. That is to say, every LLR may be obtained with an associated estimated SNR. Different respective embodiments may handle such different respective processing and handling is a function of SNR. For example, in one embodiment, the processing of the signal is performed similarly for all respective portions of the signal, and then those portions of the signal associated with one or more impulse and/or burst noise events are then modified based upon the corresponding SNR associated with the one or more impulse and/or burst noise events. For example, different respective impulse and/or burst noise events may deleteriously affect different respective portions of a signal, and each respective impulse and/or burst noise event may correspondingly have a different respective associated SNR. The SNR associated with a given impulse and/or burst noise event is then used to modify the values, estimates, etc. associated with that particular portion of the signal after they have been initially calculated using a common SNR associated with the other respective portions of the signal.

In another embodiment, the processing of the signal, that considers, at least in part, SNR associated with the signal, is inherently modified based upon the different respective SNR associated with a portion of the signal that is impulse and/or burst noise affected. When a different respective value of SNR is considered and employed for processing a portion of the signal that is impulse and/or burst was affected, then the respective SNR value associated with the impulse and/or burst noise affected portion of the signal is inherently included within the processing of the signal.

Referring to the diagram, the output from the outer code encoder is provided to an interleaver (π), which may be implemented as a rectangular or convolutional interleaver if desired in certain embodiments. The output from the interleave are split along at least two respective paths, one of which undergoes encoding using an inner code encoder and the other which does not undergo inner code encoding. The inner code encoder may be implemented as a soft-in soft-out decodable code (e.g., coded bit using LDPC, turbo code, etc.). After performing appropriate serial to parallel conversion, subsequently, a symbol mapper is implemented to perform mapping of the c inner code encoded bits and the M-c uncoded bits (e.g., uncoded with respect to the inner code encoder, but still coated with respect to the outer code encoder). That is to say, in one embodiment, the symbol mapper operates to perform symbol mapping of M-bit constellation symbols (e.g., c inner code encoded bits and the M-c uncoded bits [again, uncoded with respect to the inner code encoder]).

The symbol mapper may be viewed as performing constellation mapping using an M-bit symbol modulation. For example, if desired, a $2^M$ quadrature amplitude modulation (QAM) modulation may be employed in one preferred embodiment. However, it is noted that any desired modulation (e.g., having different respective shapes, constellation distributions, etc.) may alternatively be employed without departing from the scope and spirit of the invention. In some embodiments, c may be equal to M. That is to say, there may be some embodiments in which all of the bits output from the interleaver do in fact undergo inner code encoding.

Figure 7:
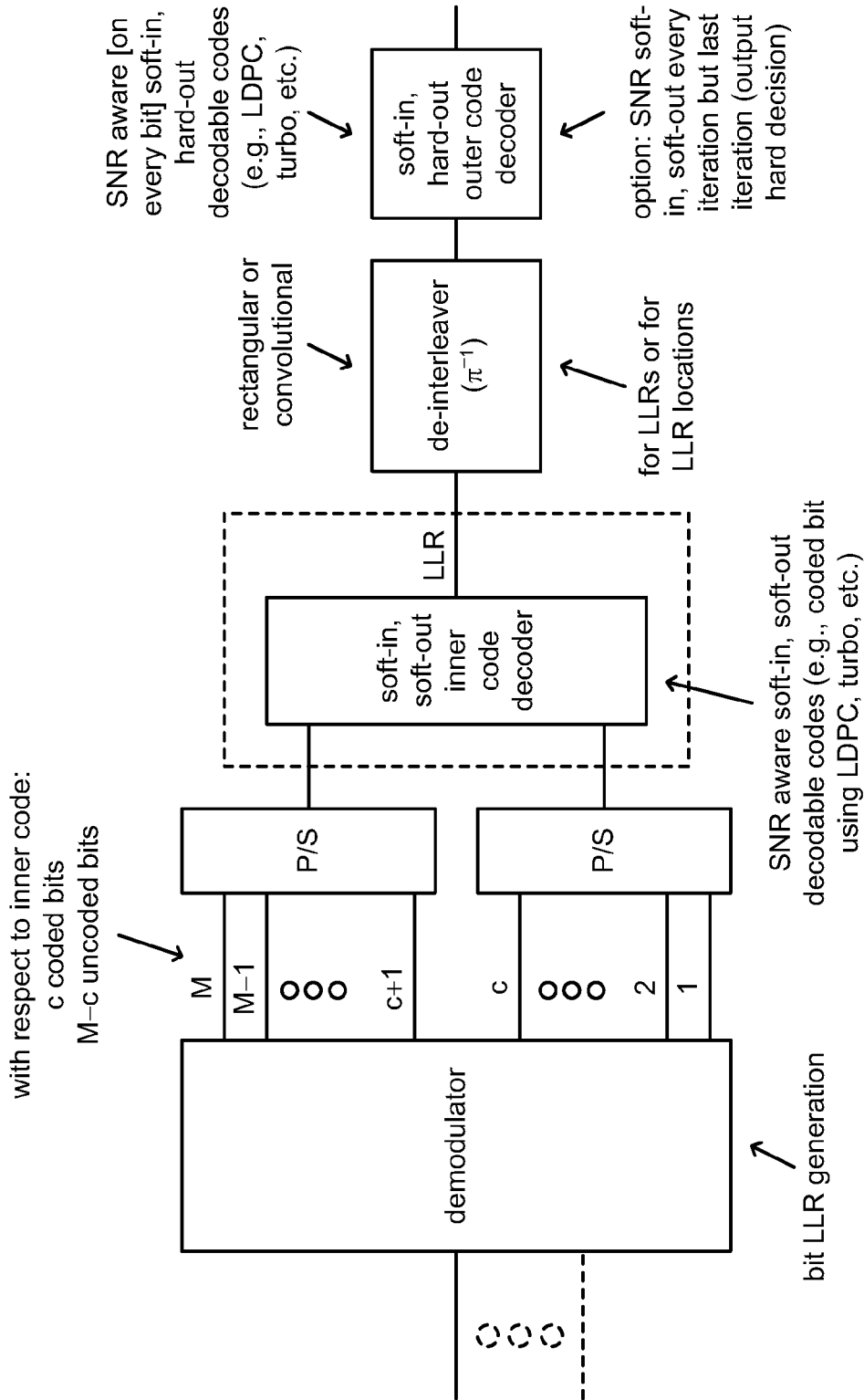
FIG. 7 illustrates an embodiment of impulse and/or burst noise SNR aware concatenated FEC, and particularly showing a decoder and/or receiver side associated therewith.

FIG. 7 illustrates an embodiment 700 of impulse and/or burst noise SNR aware concatenated FEC, and particularly showing a decoder and/or receiver side associated therewith. As may be seen with respect to this diagram, an input is implemented to receive a signal from a communication channel. A demodulator is implemented to process the signal to extract at least a first bit that is outer coded and at least a second bit that is not inner code encoded. For example, considering the correspondence and relationship of this diagram to the previous diagram, certain bits may have undergone inner code encoding while others may have not. An inner decoder is implemented to process the at least the first bit for combination with the at least the second bit to generate an inner decoded signal, after having undergone any appropriate parallel to serial conversion. That is to say, for any bit that has undergone inner code encoding, that particular bit is decoded by the inner coder and combined with any one or more bits that have not undergone inner code encoding. Such inner code decoding may be viewed as being performed as soft-in soft-out decoding that is SNR aware. For example, impulse and/or burst noise SNR awareness is employed in accordance with such inner code decoding. The output from such an inner code decoder is provided to a deinterleaver implemented to process such an inner decoded signal to generate a deinterleaved signal. The deinterleaver may be implemented for respective LLR's or for respective LLR locations in different respective embodiments. It is also noted that any of a number of signaling schemes may be employed within this and other architectures, embodiments, etc. in accordance with any one or more of the various aspects, embodiments, and/or their equivalents, of the invention (e.g., orthogonal frequency division multiplexing (OFDM), code division multiple access (CDMA), synchronous code division multiple access (S-CDMA), and/or any other type of signaling scheme, etc.).

Subsequently, an outer decoder is implemented to process the deinterleaved signal to generate at least one hard decision associated with at least one of the at least the first bit and the at least the second bit. Such outer code decoding may be viewed as being performed as soft-in hard-out decoding that is SNR aware. For example, impulse and/or burst noise SNR awareness is employed in accordance with such outer code decoding. It is further noted that such outer code decoding may in fact be implemented using an iterative decoding (e.g., a soft-in soft-out type of decoding), such that soft-in soft-out decoding is performed and every decoding iteration except for the last decoding iteration during which a hard decision is output.

As may be understood with respect to the various diagrams and/or embodiments presented herein, when an impulse and/or burst noise event occurs, a first SNR is employed for processing those portions of the signal that are not impulse and/or burst noise affected, while at least one other SNR is employed for processing those portions of the signal that are in fact impulse and/or burst noise affected. As such, those portions of the signal that may be affected by an impulse and/or burst noise event need not be treated as erasures. As also described herein, different respective SNR's may be associated respectively for different respective impulse and/or burst noise events. For each respective impulse and/or burst noise event, the SNR associated therewith may be employed in accordance with processing that portion of the signal.

In addition, it is noted that the implementation of SNR awareness with respect to impulse and/or burst noise events may vary in different embodiments. For example, in one embodiment, the entirety of the signal may be processed in a common in similar manner, and then those portions of the signal associated with one or more impulse and/or burst noise events are subsequently modified based on the SNR associated with that one or more impulse and/or burst noise events. In an alternative embodiment, a different respective SNR may be employed in accordance with processing those portions of the signal associated with one or more impulse under burst noise events. Such processing that considers, at least in part, SNR would correspondingly be modified based on the SNR of the impulse under burst noise event. As may be understood, given that the location and duration of impulse under burst noise events may be known with relative specificity, adaptive handling of different respective portions of a signal may be made based on the SNR associated with one or more burst noise events. Generally speaking, the SNR associated with an impulse and/or burst noise event may be viewed as being a special or different SNR that is used for processing those portions of the signal that are not impulse under burst noise affected.

In another alternative embodiment, if any impulse and/or burst noise is identified as being associated with a given codeword, and that codeword need not undergo inner code decoding. Instead, the outer code decoder could operate directly on such a codeword in an effort to try to recover the codeword that has been deleteriously affected by an impulse and/or burst noise event. In such an embodiment, the LLR that is generated from demodulation of the signal is particularly that which is employed in accordance with outer code decoding. For example, if any bit in such a codeword is impulse and/or burst noise affected, then it's respective LLR's would be passed from the demodulator to the outer code decoder without undergoing any inner code decoding. As may be understood, certain LLR is employed by the outer code decoder would then be those LLR's which have been generated by the demodulator, while other LLR's may be those which have been generated by the inner code decoder.

Figure 8:
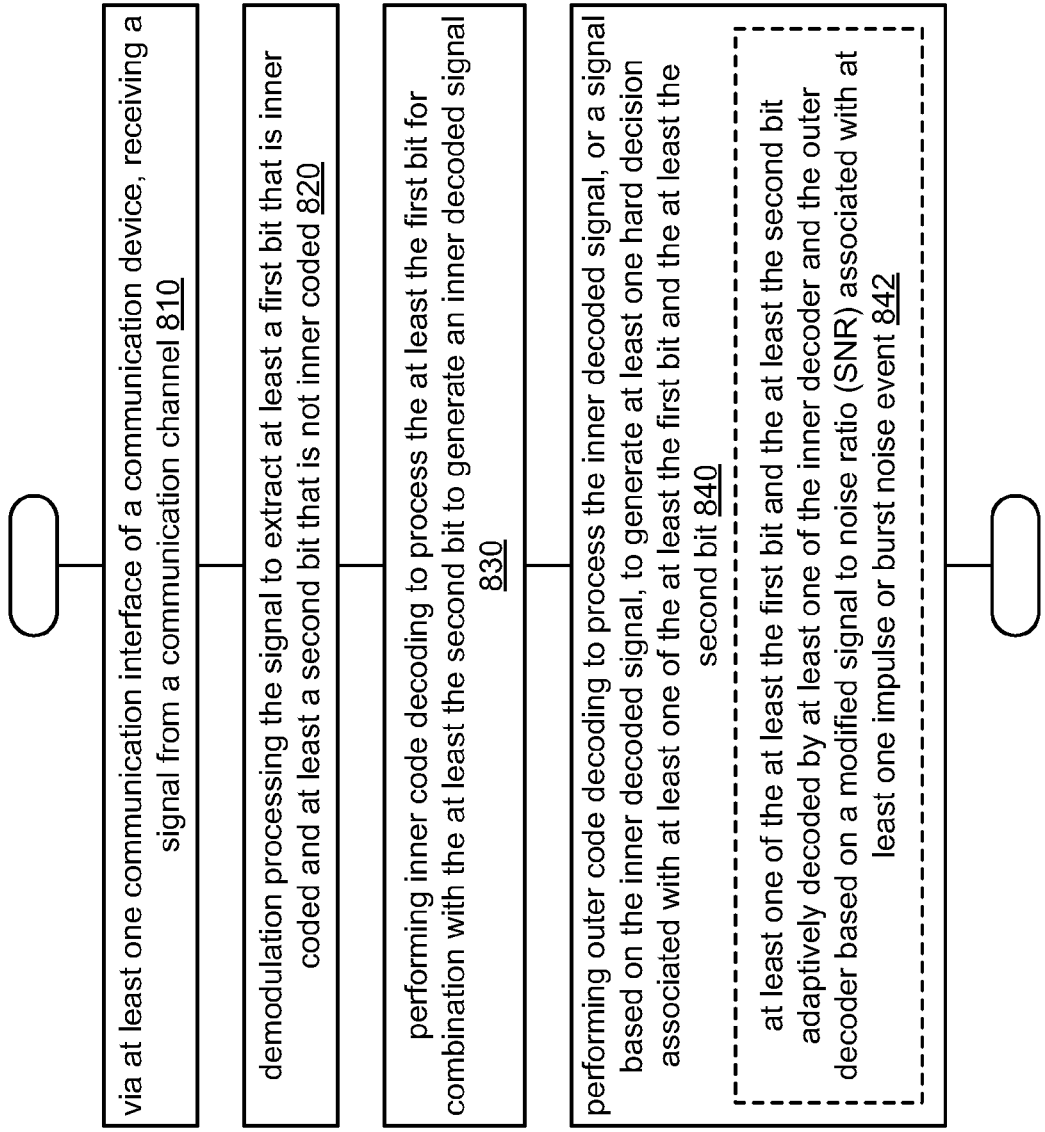
FIG. 8 and FIG. 9 illustrate various embodiments of methods for operating one or more devices including communication devices.
Figure 9:
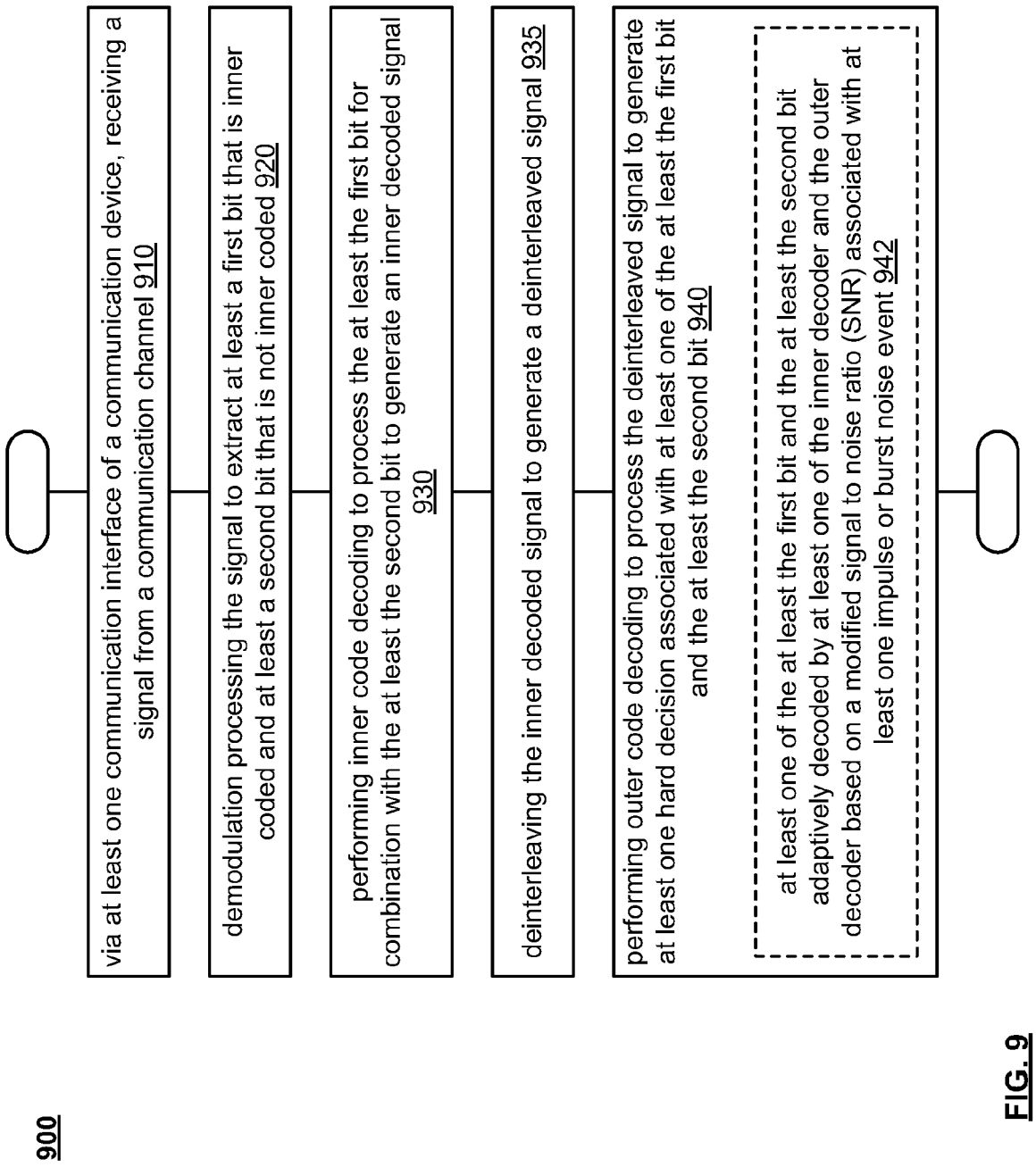

FIG. 8 and FIG. 9 illustrate various embodiments of methods for operating one or more devices including communication devices.

Referring to method 800 of FIG. 8, via at least one communication interface of a communication device, the method 800 begins by receiving a signal from a communication channel, as shown in a block 810. The method 800 continues by demodulation processing the signal to extract at least a first bit that is inner coded and at least a second bit that is not inner coded, as shown in a block 820.

The method 800 then operates by performing inner code decoding to process the at least the first bit for combination with the at least the second bit to generate an inner decoded signal, as shown in a block 830.

The method 800 continues by performing outer code decoding to process the inner decoded signal, or a signal based on the inner decoded signal, to generate at least one hard decision associated with at least one of the at least the first bit and the at least the second bit. In certain embodiments, the method 800 also operates such that at least one of the at least the first bit and the at least the second bit adaptively decoded by at least one of the inner decoder and the outer decoder based on a modified signal to noise ratio (SNR) associated with at least one impulse or burst noise event, as shown in a block 840.

Referring to method 900 of FIG. 9, via at least one communication interface of a communication device, the method 900 begins by receiving a signal from a communication channel, as shown in a block 910. The method 900 continues by demodulation processing the signal to extract at least a first bit that is inner coded and at least a second bit that is not inner coded, as shown in a block 920.

The method 900 then operates by performing inner code decoding to process the at least the first bit for combination with the at least the second bit to generate an inner decoded signal, as shown in a block 930. The method 900 then continues by deinterleaving the inner decoded signal to generate a deinterleaved signal, as shown in a block 935.

The method 900 continues by performing outer code decoding to process the deinterleaved signal to generate at least one hard decision associated with at least one of the at least the first bit and the at least the second bit. In certain embodiments, the method 900 also operates such that at least one of the at least the first bit and the at least the second bit adaptively decoded by at least one of the inner decoder and the outer decoder based on a modified signal to noise ratio (SNR) associated with at least one impulse or burst noise event, as shown in a block 940.

It is also noted that the various operations and functions as described with respect to various methods herein may be performed within any of a number of types of communication devices, such as using a baseband processing module and/or a processing module implemented therein, and/or other components therein. For example, such a baseband processing module and/or processing module can generate such signals and perform such operations, processes, etc. as described herein as well as perform various operations and analyses as described herein, or any other operations and functions as described herein, etc. or their respective equivalents.

In some embodiments, such a baseband processing module and/or a processing module (which may be implemented in the same device or separate devices) can perform such processing, operations, etc. in accordance with various aspects of the invention, and/or any other operations and functions as described herein, etc. or their respective equivalents. In some embodiments, such processing is performed cooperatively by a first processing module in a first device, and a second processing module within a second device. In other embodiments, such processing, operations, etc. are performed wholly by a baseband processing module and/or a processing module within one given device. In even other embodiments, such processing, operations, etc. are performed using at least a first processing module and a second processing module within a singular device.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" (e.g., including various modules and/or circuitries such as may be operative, implemented, and/or for encoding, for decoding, for baseband processing, etc.) may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory (ROM), random access memory (RAM), volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction with software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. An apparatus, apparatus comprising:
 an input configured to receive a signal from a communication channel;
 a demodulator configured to process the signal to generate a plurality of bits in a parallel format and to extract at least a first bit that is inner coded and at least a second bit that is not inner coded there from;
 at least one parallel to serial processor configured to arrange the plurality of bits in the parallel format and to generate a serial bit stream;
 an inner decoder configured to receive the serial bit stream and to process the at least the first bit for combination with the at least the second bit to generate an inner decoded signal;
 a deinterleaver configured to process the inner decoded signal to generate a deinterleaved signal; and
 an outer decoder configured to process the deinterleaved signal to generate at least one hard decision associated with at least one of the at least the first bit and or the at least the second bit; and
 at least one of the at least the first bit or the at least the second bit is adaptively decoded by at least one of the inner decoder or the outer decoder based on a modified signal to noise ratio (SNR) associated with at least one impulse noise event or burst noise event.

2. The apparatus of claim 1, wherein the inner decoder is a soft-in soft-out decoder, and the outer decoder is a soft-in hard-out decoder.

3. The apparatus of claim 1, wherein the inner decoder is a soft-in soft-out decoder, and the outer decoder is an iterative decoder implemented to perform soft-in soft-out decoding in all decoding iterations except a last decoding iteration during which the at least one hard decision is generated.

4. The apparatus of claim 1, wherein:
 the inner decoder is a soft-in soft-out decoder;
 the outer decoder is a soft-in hard-out decoder; and
 at least one of the soft-in soft-out decoder or the soft-in hard-out decoder is configured to operate using at least one of low density parity check (LDPC) coding, turbo coding, BCH (Bose and Ray-Chaudhuri, and Hocquenghem) coding, Reed-Solomon (RS) coding, convolutional coding, or turbo trellis coded modulation (TTCM) coding.

5. The apparatus of claim 1 further comprising:
 a communication device that is operative within at least one of a satellite communication system, a wireless communication system, a wired communication system, a fiber-optic communication system, or a mobile communication system.

6. An apparatus comprising:
an input configured to receive a signal from a communication channel;
a demodulator configured to process the signal to extract at least a first bit that is inner coded and at least a second bit that is not inner coded;
an inner decoder configured to process the at least the first bit for combination with the at least the second bit to generate an inner decoded signal;
an outer decoder configured to process the inner decoded signal, or a signal based on the inner decoded signal, to generate at least one hard decision associated with at least one of the at least the first bit or the at least the second bit; and
at least one of the inner decoder or the outer decoder is configured adaptively to decode at least one of the at least the first bit or the at least the second bit based on a modified signal to noise ratio (SNR) associated with at least one impulse noise event or burst noise event.

7. The apparatus of claim 6, wherein the inner decoder is a soft-in soft-out decoder, and the outer decoder is a soft-in hard-out decoder.

8. The apparatus of claim 6, wherein the inner decoder is a soft-in soft-out decoder, and the outer decoder is an iterative decoder implemented to perform soft-in soft-out decoding in all decoding iterations except a last decoding iteration during which the at least one hard decision is generated.

9. The apparatus of claim 6, wherein:
the inner decoder is a soft-in soft-out decoder;
the outer decoder is a soft-in hard-out decoder; and
at least one of the soft-in soft-out decoder or the soft-in hard-out decoder is configured to operate using at least one of low density parity check (LDPC) coding, turbo coding, BCH (Bose and Ray-Chaudhuri, and Hocquenghem) coding, Reed-Solomon (RS) coding, convolutional coding, or turbo trellis coded modulation (TTCM) coding.

10. The apparatus of claim 6, further comprising:
a deinterleaver, implemented between the inner decoder and the outer decoder, and configured to process the inner decoded signal to generate the signal based on the inner decoded signal.

11. The apparatus of claim 6 further comprising:
the demodulator configured to process the signal to generate at least one log-likelihood ratio (LLR) of at least one bit therein; and
the outer decoder configured to process the at least one LLR to generate at least one additional hard decision associated therewith.

12. The apparatus of claim 6 further comprising:
the demodulator configured to process the signal to generate a plurality of bits in a parallel format; and further comprising:
at least one parallel to serial processor configured to arrange the plurality of bits in the parallel format and to provide a serial bit stream to the inner decoder.

13. The apparatus of claim 6 further comprising:
a communication device that is operative within at least one of a satellite communication system, a wireless communication system, a wired communication system, a fiber-optic communication system, or a mobile communication system.

14. A method for execution by a communication device, the method comprising:
via at least one communication interface of the communication device, receiving a signal from a communication channel;
demodulation processing the signal to extract at least a first bit that is inner coded and at least a second bit that is not inner coded;
performing inner code decoding to process the at least the first bit for combination with the at least the second bit to generate an inner decoded signal; and
performing outer code decoding to process the inner decoded signal, or a signal based on the inner decoded signal, to generate at least one hard decision associated with at least one of the at least the first bit or the at least the second bit including adaptively decoding at least one of the at least the first bit and the at least the second bit using at least one of the inner code decoding or the outer code decoding based on a modified signal to noise ratio (SNR) associated with at least one impulse noise event or burst noise event.

15. The method of claim 14 further comprising:
performing soft-in soft-out decoding for performing the inner code decoding; and
performing soft-in hard-out decoding for performing the outer code decoding.

16. The method of claim 14 further comprising:
performing soft-in soft-out decoding for performing the inner code decoding; and
performing iterative decoding for performing the outer code decoding including performing soft-in soft-out decoding in all decoding iterations except a last decoding iteration during which the at least one hard decision is generated.

17. The method of claim 14 further comprising:
performing the inner code decoding by soft-in soft-out decoding;
performing the outer decoder by soft-in hard-out decoding; and
performing at least one of the soft-in soft-out code decoding or the soft-in hard-out decoding using at least one of low density parity check (LDPC) coding, turbo coding, BCH (Bose and Ray-Chaudhuri, and Hocquenghem) coding, Reed-Solomon (RS) coding, convolutional coding, or turbo trellis coded modulation (TTCM) coding.

18. The method of claim 14 further comprising:
deinterleaving the inner decoded signal to generate the signal based on the inner decoded signal.

19. The method of claim 14 further comprising:
demodulation processing the signal to generate at least one log-likelihood ratio (LLR) of at least one bit therein; and
performing outer code decoding to process the at least one LLR to generate at least one additional hard decision associated therewith.

20. The method of claim 14, wherein the communication device is operative within at least one of a satellite communication system, a wireless communication system, a wired communication system, a fiber-optic communication system, or a mobile communication system.

* * * * *